United States Patent [19]

Lauffer et al.

[11] 4,148,099

[45] Apr. 3, 1979

[54] MEMORY DEVICE HAVING A MINIMUM NUMBER OF PINS

[75] Inventors: Donald K. Lauffer; William P. Ward, both of Poway, Calif.

[73] Assignee: NCR Corporation, Dayton, Ohio

[21] Appl. No.: 895,329

[22] Filed: Apr. 11, 1978

[51] Int. Cl.² .................................................. G11C 13/00
[52] U.S. Cl. ........................................ 365/226; 365/191; 365/229
[58] Field of Search ................. 365/51, 191, 206, 226, 365/227, 229

[56] References Cited

U.S. PATENT DOCUMENTS

| | | | |
|---|---|---|---|
| 3,786,277 | 1/1974 | Bosse | 365/230 |
| 3,851,221 | 11/1974 | Beaulieu | 365/51 |
| 3,975,714 | 8/1976 | Weber et al. | 364/200 |

Primary Examiner—Terrell W. Fears
Attorney, Agent, or Firm—J. T. Cavender; Edward Dugas; Stephen F. Jewett

[57] ABSTRACT

A circuit for reducing the number of external pins or terminals on a memory device includes a counter circuit which periodically causes the signal on a first external pin to be provided to the power terminal of an internal power supply within the memory device and, at the same time, causes the ground level signal on a second external pin to be provided to the ground terminal of the internal power supply. At other times during the receipt of signals on the two external pins, the signal on the first pin provides both memory select and clocking functions and the signal on the second pin provides memory mode select, address, and data input and output functions.

16 Claims, 5 Drawing Figures

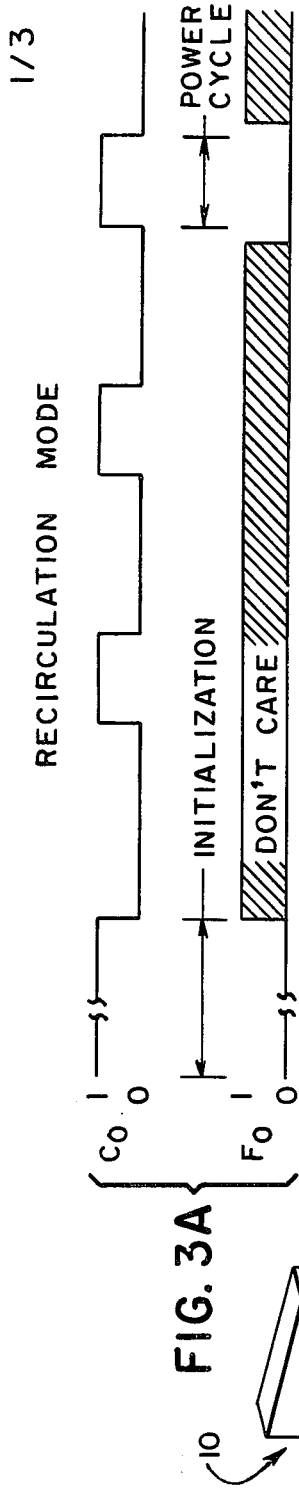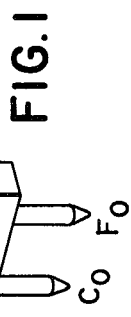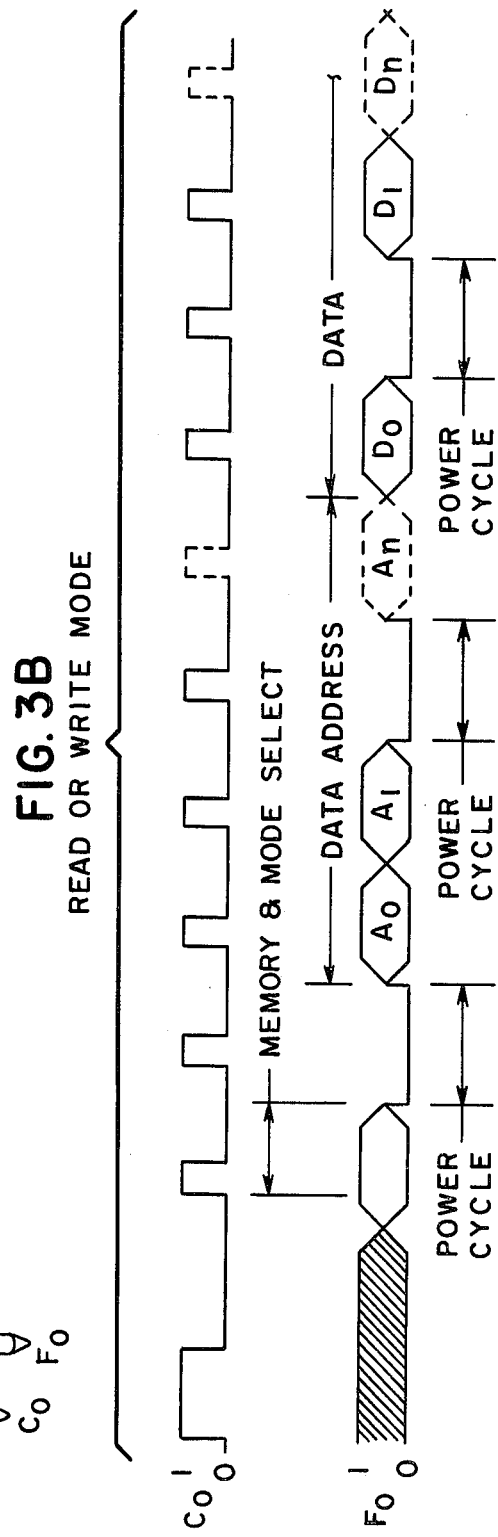

MEMORY DEVICE HAVING A MINIMUM NUMBER OF PINS

BACKGROUND OF THE INVENTION

The present invention is directed to a circuit for minimizing the number of external pins or terminals on a memory device. More particularly, the present invention is directed to a memory device wherein the external power and ground pin functions are merged with other pin or terminal functions.

Pin reduction for purposes of increasing the number of memory devices that can be assembled in a given area allocated to computer memory is the subject of co-pending U.S. application Ser. No. 812,290 filed July 1, 1977, entitled "A Minimum Pin Memory Device", and co-pending U.S. application Ser. No. 895,328 filed Apr. 11, 1978, entitled "Memory Device Having A Reduced Number of Pins", which applications are both assigned to the same assignee as the present application.

In the aforementioned application Ser. No. 812,290, pin reduction is accomplished by merging the functions provided by signals on various pins. A first terminal provides both a clocking and a memory select function. A second terminal is bi-directional and provides memory mode selection, address and data input and output functions.

Further pin reduction is provided for in the second of the abovementioned applications, namely U.S. application Ser. No. 895,328. In such application, a circuit is provided in a memory device for receiving signals applied to two external pins. A threshold detector in the circuit detects the difference in voltage level of the signals; when such difference reaches a predetermined level, the signals are applied to the power and ground terminals of an internal power supply within the memory device. Thus, the need for external power and ground terminals in a memory device is eliminated.

The subject matter of the present application provides an alternative approach to further pin reduction and the elimination of external power and ground terminals in a memory device.

SUMMARY OF THE INVENTION

In the present invention, pin reduction in a memory device is accomplished by merging the power and ground terminals with external terminals providing other functions.

In accordance with the present invention, a memory device includes two external pins which provide clocking, memory select, mode select, address, data in or data out functions, such as in a merged form. The signal at one pin goes periodically to an operating voltage level and the signal at the other pin goes periodically to ground level. Signal processing means, such as rectification circuitry, are connected to the two external pins and provide a relatively constant power signal and ground level signal to the terminals of an internal power supply within the memory device.

In the disclosed embodiment, one external pin receives a coded clocking signal which provides both memory selection and synchronization of the memory device. A second external pin receives signals representing memory mode selection, address, data input and data output. Counter circuit means are provided for counting the cycles or pulses of the clocking signal received on the first external pin and when a predetermined number of pulses have been received, such counter operates switch means which connect the first external pin to the power terminal of the internal power supply and which connect the second external terminal, then at a ground or reference voltage level, to the ground or reference terminal of the internal power supply.

A memory device in accordance with the present invention can thus be seen to have as few as two external pins, with one pin receiving a signal which provides synchronization, memory selection and power functions. The second external pin receives signals providing memory mode selection, address, data input, data output and ground functions.

It is therefore one object of the present invention to provide a memory device having a minimum number of external pins or terminals.

It is a further object of the present invention to provide a memory device without external power and ground terminals.

It is another object of the present invention to use a clocking signal for providing a power signal to a memory device and to use a second signal having other functions for providing a ground signal to such device.

Still a further object of the present invention is to provide a memory device having a few as two external pins, with such pins providing power and ground, as well as memory device selection, memory mode selection, memory address and data input and output functions.

These and other objects of the present invention will become more apparent when taken in conjunction with the following description and the attached drawings.

BRIEF DESCRIPTION OF THE DRAWINGS

FIG. 1 is a perspective view of a memory device in integrated circuit structure form and made in accordance with the present invention;

FIGS. 3A and 3B are waveforms illustrating the operation of the circuit of FIGS. 2A and 2B.

DESCRIPTION OF THE PREFERRED EMBODIMENT

In FIG. 1, a memory device 10, in monolithic integrated circuit form, has two external pins or terminals, labelled $C_O$ and $F_O$. The memory device includes a memory element, such as a charge coupled device (CCD) and, as will be more fully described later, the $C_O F_O$ pins provide all the necessary external inputs and outputs to the memory device 10 and the memory element therein.

Figure 2A:
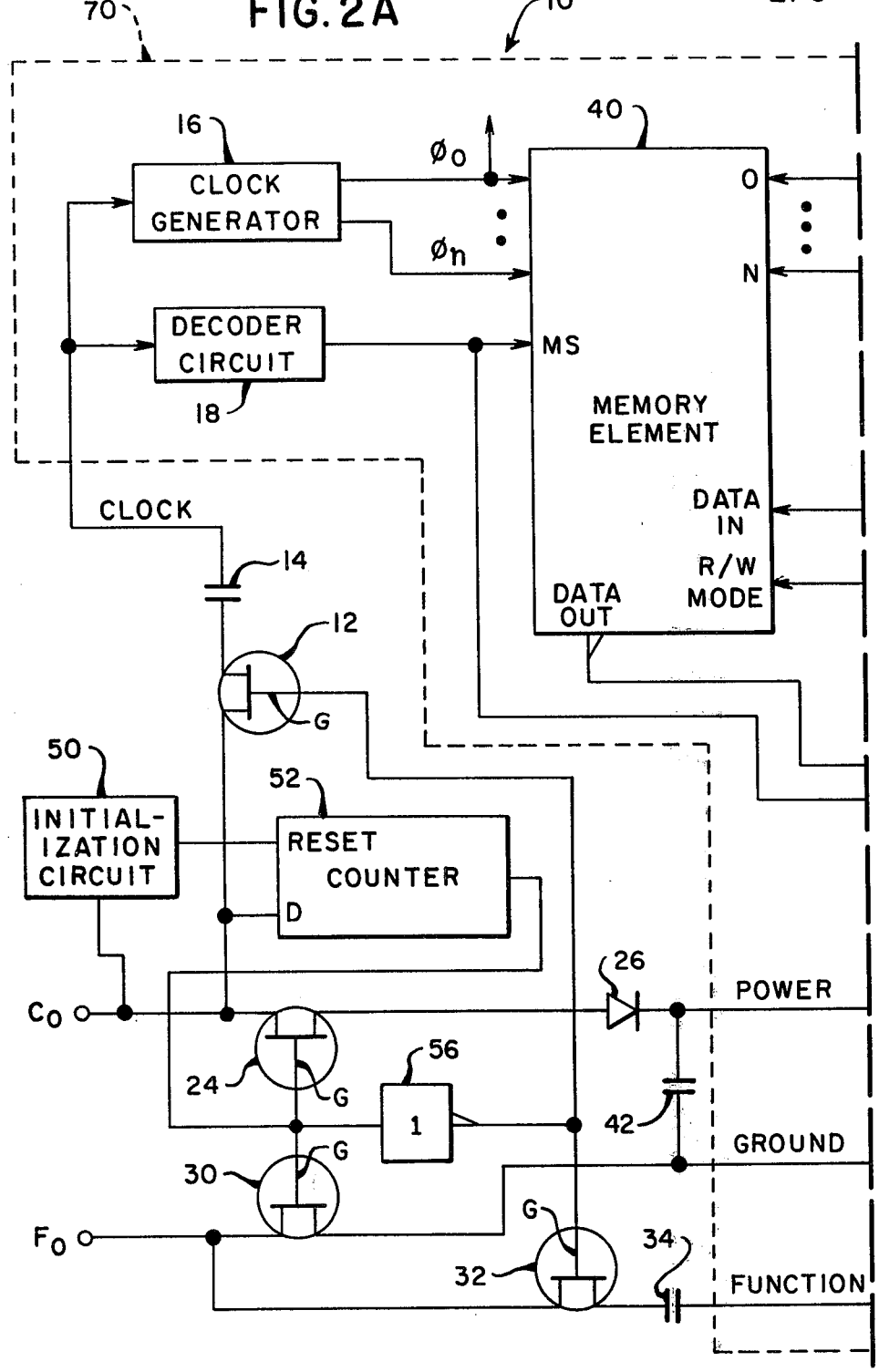
FIGS. 2A and 2B are, taken collectively, a circuit block diagram of the memory device shown in FIG. 1.
Figure 2B:
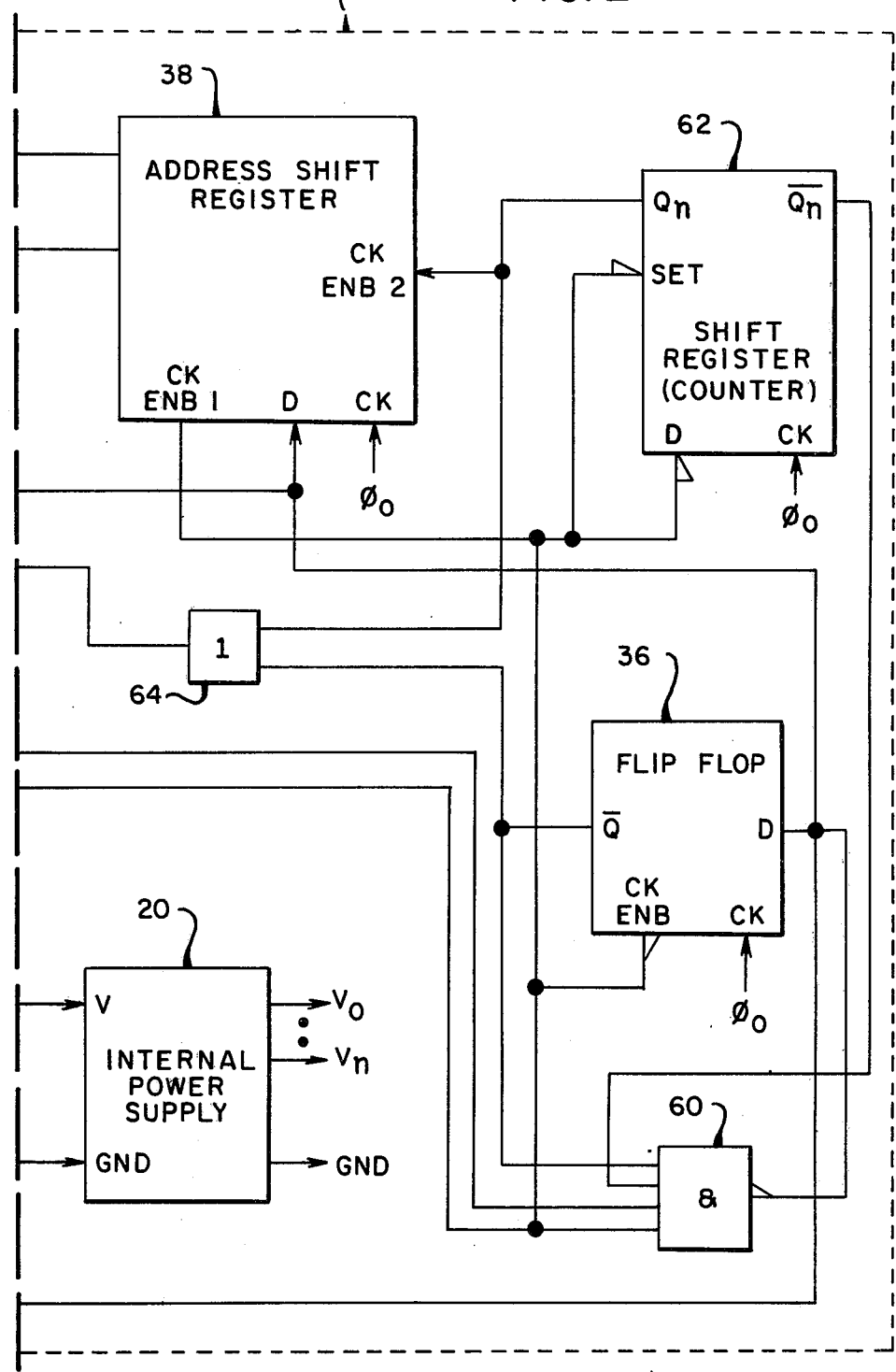

Referring now to FIGS. 2A and 2B, the memory device 10 is illustrated in block diagram form. The $C_O$ pin is selectively connected by way of a field effect transistor 12 and a coupling capacitor 14 to a clock generator circuit 16 and a decoder circuit 18. The $C_O$ is also selectively connected to the power input terminal V of an internal power supply 20 by way of a field effect transistor 24 and a diode 26. The $F_O$ pin is selectively connected to the ground input terminal GND of the internal power supply 20 by way of a field effect transistor 30. The $F_O$ terminal is also selectively connected, by way of a field effect transistor 32 and a coupling capacitor 34, to the output of a NAND gate 60 and to the inputs of various data receiving components within the memory device; more specifically, to the D input of a D-type flip-flop 36, to the D input of an address shift register 38, and to the DATA IN terminal of a memory element 40, which, as mentioned earlier, may be a CCD or some other type of memory element. A capacitor 42 is connected across the leads to the power terminal V and the ground terminal GND of the internal power supply 20.

The transistors 12, 24, 30 and 32 are periodically activated by circuitry that includes an initialization circuit 50 and a counter circuit 52. The initialization circuit 50 has its input connected to the $C_O$ terminal and is connected at its output to the RESET input of the counter circuit 52. The other input D of the counter circuit 52 is connected directly to the $C_O$ terminal.

The initialization circuit 50 delivers, upon receipt of a widened clock pulse on pin $C_O$, at the beginning of operation of the memory device, a signal to the RESET input of the counter 52 so that the counter may begin to count the clock pulses at the $C_O$ terminal and also cause an initial voltage to be provided across the power terminal V and the ground terminal GND of the internal power supply 20. Circuits which sense a change in pulse width are well-known in the art and could comprise generally a delay network and a flip-flop. Such a circuit could also be used in the previously mentioned decoder circuit 18 although, for reasons which will become apparent later, initialization circuit 50 should sense only a pulse width change wider than the pulse width change sensed by decoder circuit 18. A circuit of the type which could be used in decoder circuit 18 and initialization circuit 50 is described in greater detail, for example, in the aforementioned U.S. application Ser. No. 812,290.

The counter circuit 52 is also a circuit well-known to those skilled in the art. It is initialized or reset by a signal at its RESET input, and counts the positive pulses received at its D input. It provides an enabling signal at its output each time a predetermined number of pulses at its D input are counted, and also when the circuit is initialized by a signal at the RESET input.

The output of the counter circuit 52 is connected to the gates G of the field effect transistors 24 and 30 and to the input of an inverter 56. The output of the inverter 56 is connected to the gates G of the field effect transistors 12 and 32.

Incidentally, it should be noted that the internal power supply 20 provides the necessary operating voltages $V_O$ through $V_n$ and a ground level signal GND to various active circuit components within the memory device 10, including the initialization circuit 50, the counter circuit 52, and the inverter 56.

Those portions of the memory device in FIGS. 2A and 2B which are shown enclosed by broken lines 70 are essentially the circuit structure shown and described in the previously mentioned application Ser. No. 812,290. Accordingly, reference can be had to such application for a more detailed description of the individual components and the operation of the circuit within the broken lines 70. It can be noted that the circuit within lines 70 has four inputs which carry signals labeled CLOCK, POWER, GROUND AND FUNCTION, and in the present memory device 10 these four signals originate from the signals applied at the two pins $C_O$ and $F_O$.

As will be described in greater detail below, the signals applied to the $C_O$ and $F_O$ pins are processed or rectified by the circuitry which is located outside the broken lines 70 to provide the POWER and GROUND signals delivered to the circuit within the lines 70. In addition, the CLOCK signal is delivered to the clock generator 16 and the decoder circuit 18 from the $C_O$ pin. The FUNCTION signal is delivered to the flip-flop 36, address shift register 38 and memory element 40 from the $F_O$ pin.

It should be noted that the CLOCK signal delivered to the clock generator 16 and the decoder circuit 18 is a merged function signal in that it is coded to provide a memory selection signal as well as providing a clocking or synchronizing signal. The FUNCTION signal present on the $F_O$ terminal and delivered to the flip-flop 36, address shift register 38 and memory element 40 is also a merged function signal in that it provides, by appropriate coding techniques and in conjunction with the CLOCK signal, mode selection, memory address, data input and data output functions.

To illustrate the above, reference can be had to FIGS. 3A and 3B, which show waveforms representing the signals applied to the $C_O$ and $F_O$ pins. Turning first to FIG. 3A, the depicted waveforms illustrate a recirculation mode, that is, a condition where the memory device 10 has not been selected to receive or provide data, and the data within the memory element 40 is being recirculated within the memory element 40 as it is held ready for use. In this condition, substantially periodic and uniformly spaced clock pulses are received on the $C_O$ pin and are carried to the clock generator circuit 16 which provides the necessary clocking signals, designated $\phi_O$ through $\phi_n$, to the memory element 40 for proper recirculation of the data, and to the other components within the memory device 10 requiring a clock signal.

It should be noted that when the memory device 10 is first used, it is necessary that a long initialization pulse first be received at pin $C_O$, such pulse being shown in FIG. 3A. During this initialization period, the initialization circuit is caused to generate a signal which, when received by the counter 52, in turn causes the counter 52 to generate an enabling signal to activate the transistors 24 and 30. The positive voltage at the pin $C_O$ and the ground level signal then at the $F_O$ pin are applied to the capacitor 42 and to the input terminals of the power supply 20. This period of initialization is long enough to fully charge the capacitor 42 such that a relatively constant voltage continues across the V and GND terminals of the power supply after initialization until voltages are again applied (in a periodic fashion) to the V and GND terminals, as will be described.

The receipt of the initialization pulse and the resulting signal at the output of the initialization circuit also resets the counter 52 in the memory device 10. After initialization, the counter 52 counts the positive pulses (and cycles) of the signal received at the $C_O$ pin and after receipt of the proper number of pulses, an enabling signal appears at the output of the counter 52 and causes the transistors 24 and 30 to become conductive. During the period that the transistors 24 and 30 are conductive, generally identified in FIGS. 3A and 3B as the "power cycle", the positive pulse at $C_O$ is applied to the V terminal of the internal power supply and the signal at the $F_O$ terminal, which is at ground level, is applied to the ground terminal of the internal power supply 20. After the first power cycle, the counter circuit 52 again counts the pulses received at $C_O$, and after the proper number is received, the transistors 24 and 30 are again made conductive. Because of the periodic receipt of positive pulses at the power terminal V and ground level signals at the ground terminal GND, the capacitor 42 maintains a substantially constant voltage across the terminals. Although in the waveforms illustrated in FIGS. 3A and 3B a power cycle occurs every third pulse at pin $C_O$, the actual frequency of the power cycles may be different, depending on what is required to maintain the desired voltage across the terminals of the power supply.

At times other than the power cycle, the inverter 56 causes the transistors 12 and 32 to be conductive, and the pulses received at the $C_O$ pin are provided by way of the capacitor 14 to the clock generator 16 and decoder circuit 18. The signals at the $F_O$ pin are provided by way of the capacitor 34 to the flip-flop 36, address shift register 38 and memory element 40. However, since the memory device is in a recirculation mode, the signal levels at the $F_O$ pin are, as illustrated by shading, in a "DON'T CARE" condition.

Incidentally, the coupling capacitors 14 and 34 are provided to eliminate direct current voltages which might be present on the $C_O$ and $F_O$ pins and which might thereby be transmitted to the circuit components within the memory device. These capacitors are necessary since the ground terminal GND of the internal power supply only periodically receives a ground level signal and the ground signal provided at the output of the internal power supply 20 may otherwise float with respect to "true ground" at times when the ground level signal is not applied at the ground input terminal GND of the power supply.

Referring now to FIG. 3B, there is illustrated the condition when the memory device 10 and its memory element 40 have been selected for either reading or writing data, preceded by the recirculation mode. The memory element is selected by decreasing the width of the positive clock pulse applied at the $C_O$ pin. Since data is written or read at a much higher frequency than the frequency at which it is shifted during the recirculation mode, the frequency of the positive clock pulses also increases in FIG. 3B. It should be noted that although the clock frequency of FIG. 3B is illustrated graphically as increasing to twice the clock frequency of FIG. 3A, the frequency in the read or write mode may be a much higher multiple of the recirculation mode frequency. In the illustrated memory device, the external data line to the $F_O$ pin is assumed to be common with the external data line to other memory devices, and so data pulses will be present on the $F_O$ even during the recirculation mode, such data pulses having the same frequency as the clock frequency in the read or write mode. In order to assure that the positive clock pulse during each power cycle of the recirculation mode will occur when the $F_O$ is at ground level, as determined by each power cycle of the read or write mode, it is preferable that the clock frequency of FIG. 3B become a multiple of the clock frequency of FIG. 3A. However, if the external data line to the $F_O$ pin is not common to other memory devices, the clock frequencies of FIGS. 3A and 3B may be independent of one another.

It should also be noted that the decoder circuit 18 is only sensitive to the change in clock pulse width for memory selection, and not to the greater change in clock pulse width occurring at initialization. In a pulse width sensing circuit having a delay network and flip-flop described earlier, the initialization circuit could be accomplished by increasing the delay in the delay network, over that in the decoder circuit.

Referring still to FIG. 3B, the positive clock pulse at $C_O$ narrows during the period identified as "Memory & Mode Select" and the decoder circuit 18 senses the change in pulse width and provides a memory select (MS) signal (logic level "1") to the memory element 40, to one input of a NAND gate 60, to the CK ENB terminal of the flip-flop 36, to the CK ENB 1 terminal of the address shift register 38, and to the D and SET inputs of a shift register or counter 62.

During the "Memory & Mode Select" period the $F_O$ pin is either at a "0" logic level or at a "1" logic level, to indicate the memory mode selection, i.e., whether the memory element 40 is selected for reading ("0" logic level) or for writing ("1" logic level). The mode select signal at the $F_O$ pin during the "Memory & Mode Select" period is applied to the D input of the flip-flop 36 where, with the memory select (MS) signal generated by the decoder circuit 18 and delivered to the CK ENB (clock enable) terminal of flip-flop 36, the mode select signal (either a "0" or a "1" level) is latched into the flip-flop 36 when a clock pulse is received at the CK (clock) terminal and appears at its $\overline{Q}$ output.

After the MS signal is also received at the SET and D inputs of the shift register 62, the shift register 62 begins to count to a present number corresponding to the number of bits $A_O$ through $A_n$ (FIG. 3B) serially received on the $F_O$ pin and representing the address location which is to be selected in the memory element 40. When the proper number of bits has been counted by the shift register 62, an enabling signal (logic level "0") from the $Q_n$ output of the shift register 62 is applied to the CK ENB 2 terminal of the address shift register 38 and to one input of an OR gate 64. At such time the OR gate 64 passes the mode select signal from the $\overline{Q}$ output of flip-flop 36 to the R/W MODE input of the memory element 40 and the pertinent address data bits ($A_O$ through $A_n$) which have been received at the D input of the address shift register 38 are presented to the address inputs O through N of the memory element 40.

If data bits ($D_O$ through $D_n$) on the $F_O$ pin are to be written into the memory element, such data is presented in serial form to the DATA IN terminal of the memory element 40. If data is to be read from the memory element, the data bits ($D_O$ through $D_n$) in the memory element at the address specified by the address iputs O through N are presented in serial form at the DATA OUT terminal of memory element 40 and carried to the $F_O$ pin by way of the NAND gate 60.

Although the operation of the circuit components within the broken lines 70 has been described briefly, a more detailed discussion can be obtained, as mentioned earlier, by reference to the aforementioned application Ser. No. 812,290.

From the above, it can be seen that a memory device in integrated circuit form that includes a memory element can be provided having only two external pins or terminals. The signals provided at the two external pins are coded to provide synchronizing, memory selection, mode selection, memory address, data input and data output functions, and the signals are rectified to provide the necessary power and ground signals to the internal power supply within the integrated circuit structure. It should be understood, of course, that signal coding techniques other than those described above could be used for providing the memory select, mode select, memory address, and data input and data output functions, as long as the signals can be rectified to develop a sufficient voltage difference for providing the power and ground signals.

Although a specific embodiment of the invention has been shown in detail, it will be understood by those skilled in the art that changes may be made therein without departing from the spirit and scope of the invention.

What is claimed is:

1. A memory device requiring a power signal and a ground level signal, comprising:
    a memory element;
    at least two external terminals; and
    signal processing means for receiving a first signal applied to one of said external terminals and a second signal applied to the other of said external terminals, said first and second signals providing functions other than power and ground signal functions, and for processing said first and second signals to provide said power and ground level signals.

2. The memory device of claim 1, wherein first signal includes substantially periodic clock pulses and wherein said signal processing means comprises rectification means including a counter circuit for counting said clock pulses so that one out of a predetermined number of said clock pulses is rectified to provide said power signal.

3. The memory device of claim 2, wherein said memory device further comprises an internal power supply having a power terminal for receiving said power signal and a ground terminal for receiving said ground level signal and wherein said rectification means further includes capacitor means connected across the leads to said power and ground terminals of said terminal power supply.

4. In a memory device having at least two external pins and requiring a power signal and a ground level signal:
    rectification means for receiving a first signal applied to one of said external pins and a second signal applied to the other of said external pins, said first and second signals providing functions other than power and ground signal functions, and for rectifying said first and second signals to provide said power and ground level signals.

5. The memory device of claim 4, wherein said first signal includes substantially periodic clock pulses and wherein said rectification means includes a capacitor, switch means and a counter circuit for counting the clock pulses and generating an enabling signal to said switch means for connecting the one of said external pins to said capacitor after a predetermined number of clock pulses are counted, so that a relatively constant voltage is maintained across said capacitor.

6. In a memory device having an internal power supply for receiving a power signal and a ground level signal;
    a first pin for receiving a first, substantially periodic signal;
    a second pin for receiving a second signal; and
    rectification circuit means connected to said first and second pins for receiving said first and second signals and in response thereto providing said power signal and said ground level signal to said internal power supply.

7. The memory device of claim 6, wherein said rectification means includes a counter circuit for counting the number of cycles in said first signal, and for generating an enabling signal after a predetermined number of cycles are counted.

8. The memory device of claim 7, wherein said rectification means further includes switching means for receiving said enabling signal and in response thereto connecting said first pin to a first, power input terminal of the internal power supply, and said second pin to a second, ground input terminal of said internal power supply.

9. The memory device of claim 8, wherein said switching means connects said first and second external pins to said first and second internal terminals for a period after said predetermined number of cycles are counted in which said first signal is positive.

10. The memory device of claim 8, wherein said switch means includes a first pair of transistors for receiving said enabling signal directly and interposed between said first and second external pins and said first and second input terminals of said internal power supply, and a second pair of transistors for receiving said enabling signal by way of an inverter, and being interposed between said first and second external pins and an internal clock generator and an internal data receiving component within said memory device.

11. The memory device of claim 8, wherein said rectification means further includes an initialization circuit for causing said counter circuit to initially connect said first and second external pins to said first and second input terminals of said internal power supply.

12. The memory device of claim 8, wherein said rectification means further includes capacitor means connected across said first and second internal terminals so that a relatively constant voltage difference is maintained across said first and second input terminals of said internal power supply.

13. In a memory device in the form of an integrated circuit structure:
    a first pin for receiving a first synchronizing signal;
    means for detecting a change in said first synchronizing signal for enabling said memory device;
    a second pin for receiving a second signal, including memory address, data input, and internally-generated data output component signals;
    means for mode selecting said memory device in response to a mode select signal at one of said first and second external pins;
    an internal power supply for receiving a power signal and a ground level signal; and
    rectification means for receiving the first signal and the second signal on said first and second external pins and in response thereto providing said power signal and said ground level signal to said internal power supply.

14. The memory device of claim 13, wherein said rectification means includes switching means and a counter circuit, said counter circuit for counting the pulses in said first signal and after a predetermined number of said pulses are counted, providing an enabling signal to said switching means for operatively connecting said first external pin and said second external pin to said internal power supply.

15. A method for eliminating the external power and ground terminals on a memory device, comprising:
    providing a first signal on a first external pin having periodic pulses;
    providing a second signal on a second external pin which periodically is at a ground level voltage; and
    rectifying said first and second signals to provide a power and ground level signal for said memory device.

16. The method of claim 15, wherein said step of rectifying includes the step of counting the number of pulses received at said first external pin and after a predetermined number of pulses are received at said first pin, generating an enabling signal for causing said first external pin and said second external pin to be connected to the power and ground terminals of an internal power supply within said memory device.